United States Patent [19]
Horiuchi et al.

[11] Patent Number: 5,737,191
[45] Date of Patent: Apr. 7, 1998

[54] STRUCTURE AND PROCESS FOR MOUNTING SEMICONDUCTOR CHIP

[75] Inventors: Michio Horiuchi; Yoichi Harayama, both of Nagano, Japan

[73] Assignee: Shinko Electric Industries Co., Ltd., Nagano, Japan

[21] Appl. No.: 628,346

[22] Filed: Apr. 5, 1996

[30] Foreign Application Priority Data

Apr. 7, 1995 [JP] Japan ............................ 7-082385
Apr. 10, 1995 [JP] Japan ............................ 7-083679

[51] Int. Cl.$^6$ ............................................. H05K 07/02
[52] U.S. Cl. ............. 361/764; 361/760; 361/767; 361/772; 361/777; 361/779; 361/807; 361/809; 361/813; 257/787; 257/687; 257/692; 257/697; 257/778; 257/782; 257/783; 257/784; 174/52.1; 174/52.2; 174/259; 174/260; 174/251; 174/255
[58] Field of Search .................... 361/764, 767, 361/768, 783, 760, 761, 757, 772, 771, 777, 779, 807, 809, 813; 257/787, 687, 692, 697, 778, 780, 781, 782, 783, 784, 786, 735, 737, 698; 174/52.1, 52.2, 259, 260, 251, 255

[56] References Cited

U.S. PATENT DOCUMENTS

| | | | |
|---|---|---|---|
| 4,254,432 | 3/1981 | Babuka et al. | 257/713 |
| 4,323,914 | 4/1982 | Berndlmaier et al. | 257/713 |
| 5,107,325 | 4/1992 | Nakayosi | 357/69 |

FOREIGN PATENT DOCUMENTS

| | | |
|---|---|---|
| 0 603 928 | 6/1994 | European Pat. Off. . |
| 4-032251 | 2/1992 | Japan . |

OTHER PUBLICATIONS

Patent Abstracts of Japan, vol. 13, No. 333 (E–794), 26 Jul. 1989 & JP-A-01-096952 (Hitachi Ltd), 14 Apr. 1989.

Patent Abstracts of Japan, vol. 15, No. 62 (E–1033), 14 Feb. 1991 & JP-A-02-288255 (Hitachi Ltd), 28 Nov. 1990.

Patent Abstracts of Japan, vol. 16, No. 381 (E–1248), 14 Aug. 1992 & JP-A-04-122053 (Fujitsu Ltd), 22 Apr. 1992.

Patent Abstracts of Japan, vol. 17, No. 415 (E–1407), 3 Aug. 1993 & JP-A-05-082584 (NEC Corp), 2 Apr. 1993.

Patent Abstracts of Japan, vol. 18, No. 299 (E–1558), 8 Jun. 1994 & JP-A-06-061383 (Fujitsu Ltd), 4 Mar. 1994.

Primary Examiner—Leo P. Picard
Assistant Examiner—David Foster
Attorney, Agent, or Firm—Staas & Halsey

[57] ABSTRACT

A semiconductor chip mount structure includes a substrate having a base surface on which base side connectors are formed; a semiconductor chip mounted on the base surface, the semiconductor chip having chip side connectors on a first surface thereof facing the base surface, the chip side connectors being electrically connected to the base side connectors; an insulating resin layer covering the chip side connectors and the base side connectors; a metal layer, made of a metal having a melting point lower than a temperature at which the electrical components of the semiconductor chip may be thermally destroyed, for covering the semiconductor chip and the insulating resin layer; and a wetting characteristic improving layer such as a metal powder or foil layer, formed along a contact surface between the metal layer and the insulation resin layer.

29 Claims, 9 Drawing Sheets

STRUCTURE AND PROCESS FOR MOUNTING SEMICONDUCTOR CHIP

BACKGROUND THE OF INVENTION

1. Field of the Invention

The present invention relates to a mounting structure for a semiconductor element and, specifically, to a face-down type wherein connecting sections formed on a mounting surface of a circuit board on which a semiconductor element is to be mounted are electrically connected to those formed on one surface of the semiconductor element opposite to the mounting surface, and to a method for mounting the semiconductor element.

2. Description of the Related Art

There has been a recent trend wherein the connections between connecting sections on a semiconductor element and those on a circuit board have become very dense in high-performance electronic apparatuses.

In conformity with the recent trend, a face-down type mounting structure, as shown in FIG. 18 and hereinafter referred to as merely a mounting structure, has been used as a mounting structure for a semiconductor element enabling very dense connections.

In the mounting structure shown in FIG. 18, a plurality of connection terminals 204 such as solder bumps is provided, as circuit board side connecting sections, on one surface of a semiconductor element 202 opposite to a mounting surface of a circuit board 200 on which the semiconductor element is mounted. Each of the connection terminals 204 is connected to each of connection pads 208 provided, as element side connecting sections, at an end or midway of each of circuit patterns 206 formed on the mounting surface of the circuit board 200, so that the electric connection is obtained between the semiconductor element and the circuit board.

Further, in this mounting structure, an insulating resin layer 210 is sometimes provided while exposing another surface of the semiconductor element 202 as shown in FIG. 19 for the purpose of sealing the element side connecting sections and the circuit board side connecting sections electrically connected to each other.

According to the mounting structure shown in FIG. 19, it is necessary to discharge heat generated in the semiconductor element 202 from the back surface of the semiconductor element 202. However, a cap or the like is usually mounted to the semiconductor element 202 to seal the same.

Thus, the resultant mounting structure is extremely complicated in structure, which requires a longer mounting process and a higher production cost and is accompanied by a lower yield.

In addition, heat generated in the semiconductor element 202 must flow via a cap or the like for sealing the semiconductor element 202, which deteriorates the heat dissipation ability of the mounting structure whereby the heat tends to be stored in the mounting structure.

As stated above, the mounting of a cap or the like results in a complicated mounting structure and the deterioration of the heat dissipation.

To solve the above drawbacks inherent to the mounting structure shown in FIG. 19, another mounting structure of a semiconductor element is proposed in Japanese Unexamined Patent Publication (Kokai) No. 4-32251, wherein a layer of a metal having a low melting point is formed for covering an insulating resin layer 210 and a semiconductor element 202.

According to the mounting structure proposed in the above Patent Publication, since the cap or the like for sealing the semiconductor element 202 is unnecessary and the other surface (back surface) of the semiconductor element can be brought into direct contact with the low melting point metal layer, the heat generated in the semiconductor element 202 can be easily dissipated from the mounting structure.

However, the low melting point metal layer is usually brought into contact with the other surface of the semiconductor element 202 via a metalized layer of gold or the like coated on the semiconductor element 202 and also directly with the insulating resin layer 210.

On the other hand, a molten metal having a low melting point has a good wettability to the metallic layer, but has an inferior wettability to the surface of the insulating resin layer 210.

Accordingly, while the low melting point metal layer is closely adhered to the other surface of the semiconductor element 202 via the metalized layer of gold or the like, it may separate from the insulating resin layer 210 on the boundary surface therebetween. Thus, the mounting structure of the semiconductor element proposed in the above Patent Publication has a poor durability and cannot to be put into practice.

However, since the mounting structure of the semiconductor element proposed in the above Patent Publication has a favorable property for dissipating the heat generated in the semiconductor element, it is suitable as a mounting structure for a semiconductor element generating a large amount of heat.

SUMMARY OF THE INVENTION

Accordingly, an object of the present invention is to provide a mounting structure of a semiconductor element, and a method for mounting a semiconductor element, capable of preventing separation between an insulating resin layer and a layer of a metal having a low melting point covering the semiconductor element or others, which resin layer is formed by filling an insulating resin in a gap between one surface of a semiconductor element mounted onto a circuit board and a mounting surface of the circuit board, so that the durability and the heat dissipation ability are improved.

The present inventors have found that the wettability of the insulating resin layer to the molten metal having a low melting point is enhanced by bonding metallic powder on the surface of the resin layer, and have thus completed the present invention.

According to the present invention, there is provided a semiconductor chip mount structure comprising: a substrate having a base surface on which base side connectors are formed; a semiconductor chip mounted on the base surface of the substrate, the semiconductor chip having chip side connectors on a first surface thereof facing the base surface of the substrate, the chip side connectors being electrically connected to the base side connectors; an insulation resin layer arranged so as to cover connecting portions including the chip side connectors and the base side connectors; a metal layer, made of a metal having a melting point lower than an endurance temperature of the semiconductor chip, for covering the semiconductor chip and the insulation resin layer; and a wetting characteristic improved layer formed along at least a part of a contact surface between the metal layer and the insulation resin layer.

In one embodiment, the metal layer also covers at least a part of the base surface of the substrate and a second wetting characteristic improved layer is formed along at least a part of a second contact surface between the metal layer and the base surface of the substrate.

The semiconductor chip has a second surface, which is exposed from the insulation resin layer but is covered by the metal layer. A heat radiation member, such as a heat spreader or fin member, is provided on the metal layer adjacent to the second surface of the semiconductor chip. The metal layer is essentially a low melting point metal, such as solder, which melts at a temperature lower than 450°.

In one embodiment, the low melting point metal layer is a low melting point base metal and a metal powder mixed in the base metal and having a melting point higher than that of the base metal. In this case, the metal powder is one or a mixture of two or more selected from a group of tungsten (W) powder, molybdenum (Mo) powder, silver (Ag) powder and copper (Cu) powder.

In another embodiment, the low melting point metal layer is a base metal and an inorganic powder mixed in the base metal and having a melting point higher than that of the base metal. In this case, the inorganic powder is one or a mixture of two or more selected from a group of silicon dioxide ($SiO_2$) powder, silicon carbide (SiC) powder, aluminum nitride (AlN) powder, boron nitride (BN) powder and carbon (C) powder.

The insulation resin layer includes an insulation inorganic powder, such as silicon dioxide ($SiO_2$) powder.

In one embodiment, the wetting characteristic improved layer is a metal powder or metal foil layer attached onto the insulation resin layer which is in contact with the metal layer. The metal powder or metal foil layer may be a metal having a melting point higher than that of the melting point of the metal layer.

In another embodiment, the second wetting characteristic improved layer is a metal powder or metal foil layer attached onto the base surface of the substrate which is in contact with the metal layer. The metal powder or metal foil layer is a metal having a melting point higher than that of the melting point of the metal layer.

The base side connectors formed on the base surface of the substrate includes at least one ground pattern and the metal layer electrically connected to the ground pattern. The chip side connectors are electrically connected to the base side connectors by connecting terminals, such as solder bumps, mounted on the semiconductor chip.

The chip side connectors are electrically connected to the base side connectors by a tape automated bonding tape having a conductive pattern.

It is possible that a plurality of semiconductor chips are mounted on the base surface of the substrate, the semiconductor chips having respective chip side connectors which are electrically connected to the base side connectors, the insulation resin layer being arranged so as to cover connecting portions including the chip side connectors and the base side connectors, and the metal layer covering the insulation resin layer and the plurality of semiconductor chips.

Also it is possible that the substrate having the base surface on which the base side connectors are formed includes a flexible film.

According to another aspect of the present invention, there is provided a process for mounting a semiconductor chip, having chip side connectors on a first surface thereof, on a substrate having a base surface on which base side connectors are formed, the process including the steps of; mounting a semiconductor chip, on the base surface of the substrate, so that chip side connectors of the semiconductor chip are electrically connected to the base side connectors; filling an insulation resin into a gap between the base surface of the substrate and the first surface of the semiconductor chip to cover connecting portions including the chip side connectors and the base side connectors; forming a wetting characteristic improved layer on at least a part of an exposed surface of the insulation resin layer, the wetting characteristic of the wetting characteristic improved layer with respect to a low melting point metal layer is at least better than that of the insulation resin, and forming the metal layer, which is a metal having a melting point lower than an endurance temperature of the semiconductor chip, for covering the semiconductor chip and the insulation resin layer.

According to still another aspect of the present invention, there is provided a process for mounting a semiconductor chip, having chip side connectors on a first surface thereof, on a substrate having a base surface on which base side connectors are formed, the process including the following steps of: mounting a semiconductor chip on the base surface of the substrate, so that chip side connectors of the semiconductor chip are electrically connected to the base side connectors; filling an insulation resin into a gap between the base surface of the substrate and the first surface of the semiconductor chip to cover connecting portions including the chip side connectors and the base side connectors; forming first and second wetting characteristic improved layers on at least a part of an exposed surface of the insulation resin layer and at least a part of the base surface of the substrate, respectively, the wetting characteristic of the first and second wetting characteristic improved layers with respect to a low melting point metal layer is at least better than that of the insulation resin and the base surface of the substrate, respectively; forming the first and second metal layers, made of a metal having a melting point lower than an endurance temperature of the semiconductor chip, for covering the semiconductor chip, the insulation resin layer and the base surface of the substrate.

According to the present invention of the above constitution, since the other surface of the semiconductor element is exposed from the insulating resin layer and coated with the low melting point metal layer, it is possible to bring the low melting point metal layer into direct contact with the other surface of the semiconductor element to further improve the ability for dissipating the heat generated in the semiconductor element.

Also, it is possible to improve the electrical characteristics of the mounting structure of a semiconductor element by electrically connecting the low melting point metal layer to ground patterns provided on the circuit board to minimize signal noises.

In the prior art mounting structure for a semiconductor element, the surface of an insulating resin layer formed of an insulating resin filled in a gap between one surface of a semiconductor element and a mounting surface of a circuit board has a poor wettability to a molten metal having a low melting point, and thus repels the latter. Accordingly, the insulating resin layer is easily separated from the low melting point metal layer.

On the contrary, according to the present invention, a wettability improvement layer made of metallic powder is formed on at least part of the insulating resin layer and has an improved wettability to the molten metal having a lower melting point. Thus, when the molten metal having a low melting point is brought into contact with the surface of the insulating resin layer, it is possible to stick the molten metal having a low melting point onto part of the surface of the insulating resin layer wherein the wettability is improved.

As a result, it is possible to enhance the adhesion between the insulating resin layer and the low melting point metal layer, whereby the separation is prevented between the insulating resin layer and the low melting point metal layer to improve the durability of the mounting structure of the semiconductor element. Since the low melting point metal layer coats the semiconductor element, the heat dissipation ability of the mounting structure of the semiconductor element can be also improved.

In addition, if a metallic powder having a melting point higher than that of the low melting point metal is contained in the low melting point metal layer, the heat conductivity of the low melting point metal layer is enhanced to further improve the heat dissipation ability of the mounting structure. While, if an inorganic substance powder having a melting point higher than that of the low melting point metal is contained, the difference in the thermal expansion coefficient between the semiconductor element and the low melting point metal layer can be as small as possible to further enhance the durability of the mounting structure of the semiconductor element.

DETAILED DESCRIPTION OF THE PREFERRED EMBODIMENTS

The mounting structure of the semiconductor element according to the present invention is a face-down type wherein connecting sections provided on a mounting surface of a circuit board on which a semiconductor element is mounted are electrically connected to those provided on one surface of the semiconductor element opposite to the mounting surface.

Figure 1:
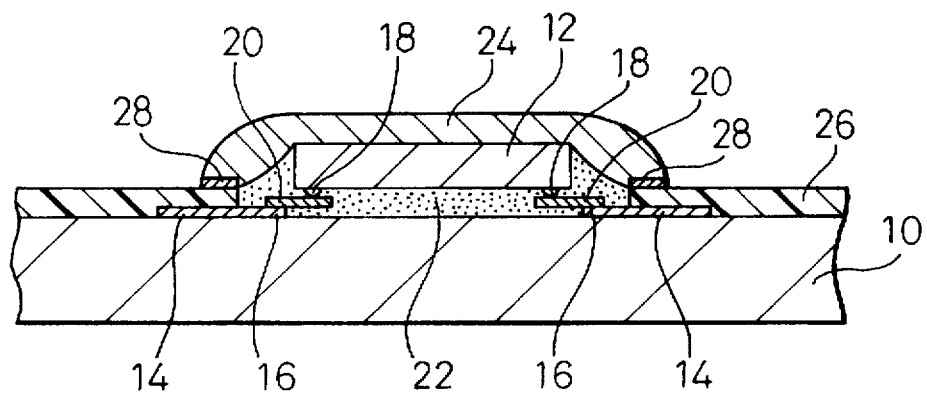
FIG. 1 is a cross-sectional view of a semiconductor chip mount structure using a base substrate according to an embodiment of the present invention.

FIG. 1 shows such a face-down type mounting structure, wherein a plurality of connection pads 16 is formed at the extremities of, or at the midway of, circuit patterns 14 provided, as circuit board side connecting sections, on a mounting surface of a circuit board 10 made of ceramic or plastic carrying a semiconductor element 12.

In this regard, the circuit board 10 may have internal circuit patterns. Also, such a circuit board 10 may either be a ball-grid-array (BGA) type having solder bumps as external terminals or a pin-grid-array (PGA) type having lead pins as external terminals.

A plurality of connection terminals (bumps) 18 is provided, as element side connecting sections, on one surface of the semiconductor element 12 opposite to the mounting surface of the circuit board 10.

Each of the terminals (bumps) 18 of the semiconductor element 12 is connected to each of the connection pads 16 via a conductor pattern 20 of a TAB (tap automated bonding) tape to achieve the electric connection between the semiconductor element 12 and the circuit board 10.

In addition, the joint portion between the semiconductor element 12 and the circuit board 10 is sealed by an insulating resin layer 22 while exposing the other surface of the semiconductor element 12. Insulating resins used for forming such an insulating resin layer 22 may be known ones conventionally used for sealing a semiconductor element, in which an epoxy type resin is suitable. An organic insulating component is preferably contained therein as a filler, such as silicon dioxide ($SiO_2$), for improving the heat conductivity of the insulating resin layer 22.

The circuit patterns 14 formed on the mounting surface of the circuit board 10 are insulated by a resin film 26 formed of an insulating resin such as polyimide resin, except for the connection pads 16 used as circuit board side connecting sections.

The insulating resin layer 22 and the other surface of the semiconductor element 12 are coated by a low melting point metal layer 24. A metal used for forming the low melting point metal layer 24 has a melting point lower than a heat durable temperature of the semiconductor element 12. Preferably, the melting point of the low melting point metal is 450° C. or lower.

If the melting point exceeds 450° C., problems on thermal durability of the semiconductor element 12 are liable to occur. On such a view point, it is preferable to use low melting point metals which melt at 250° C. or lower.

The low melting point metal may be an alloy used for brazing and preferably a solder alloy. Examples of such solder alloys are Sn—Pb type, Sn—Pb—Sb type, Sn—Pb—Ag type, Pb—In type, Pb—Ag type, Sn—Zn type, Sn—Sb type, Sn—Ag type, and Bi—Sn—In type.

In this regard, the "heat durable temperature" of the semiconductor element 12 referred to in the present invention is such a temperature that, if exceeding this temperature, the circuits or other components on the semiconductor element 12 may be thermally destroyed.

The low melting point metal layer 24 formed of such a low melting point metal and the other surface of the semiconductor element 12 are closely bonded with each other usually via a metalized layer of gold or others on the semiconductor element 12, while the resin layer 26 and the low melting point metal layer 24 are closely bonded with each other via metal layers 28 formed as wettability improvement layers on the surface of the resin layer 26 with a foil of copper or other metal or by electroless plating or by sputtering.

On the other hand, the low melting point metal layer 24 and the insulating resin layer 22 are closely bonded to each other via a wettability improvement layer formed on the surface of the insulating resin layer 22, having the improved wettability to the molten metal having a low melting point.

Figure 2:
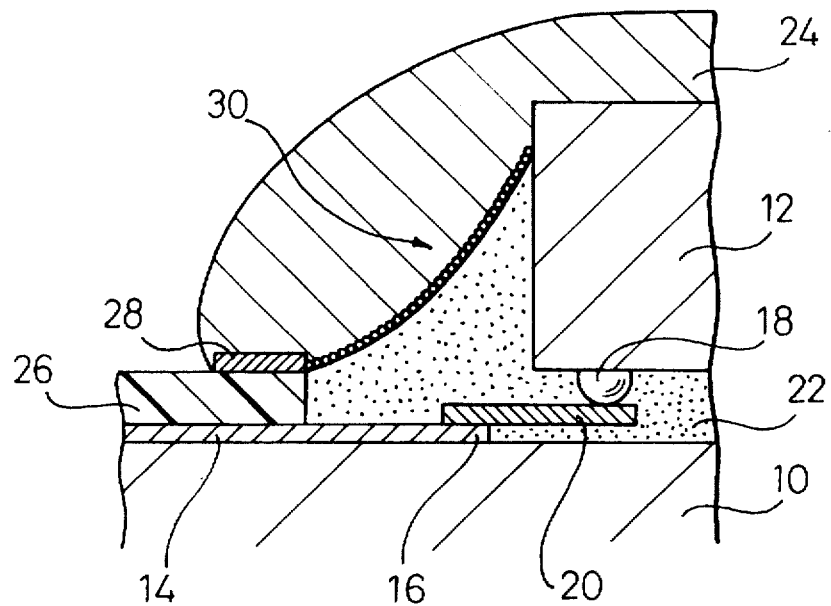
FIG. 2 is a partial enlarged view of FIG. 1, particularly showing a wetting characteristic improved layer.

The wettability improvement layer is preferably a metallic powder layer 30 made of a metallic powder bonded to the surface of the insulating resin layer 22, as shown in FIG. 2. This metallic powder layer 30 can be formed by spreading the metallic powder on the surface of the insulating resin layer 22, and thereafter curing the insulating resin layer 22 in a heated atmosphere. Particularly, if the metallic powder is spread on the surface of the insulating resin layer before the latter has fully hardened, the metallic powder is more preferably attached thereon.

Metallic powder used for this purpose has a melting point higher than that of the low melting point metal forming the lower melting point metal layer, wherein one or a mixture of two or more kinds of powders, selected from the group of tungsten (W) powder, molybdenum (Mo) powder, silver (Ag) powder and copper (Cu) powder.

Figure 3:
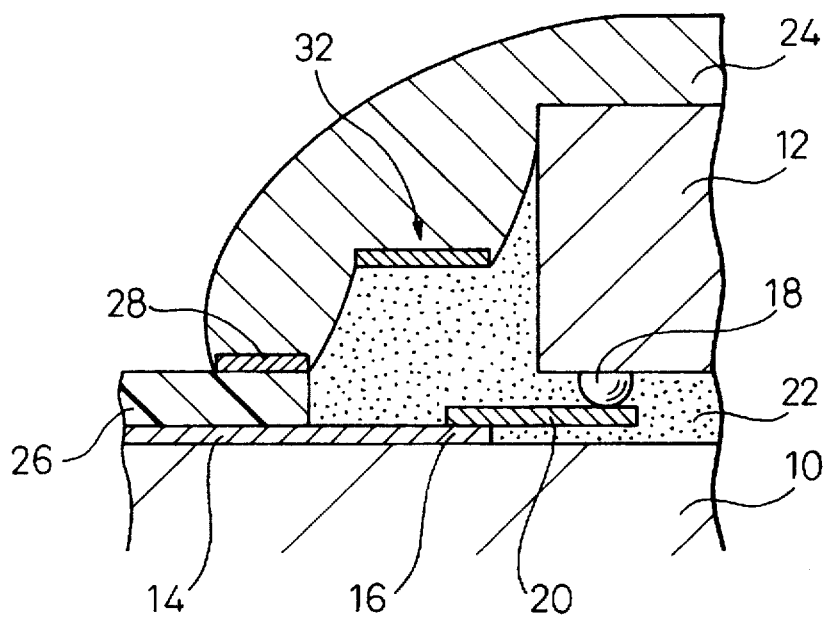
FIG. 3 is a partial enlarged view corresponding to FIG. 2, but showing another embodiment of this invention.

According to the present invention, in place of the metallic powder layer 30 shown in FIG. 2, a metal layer 32 formed on part of the surface of the insulating resin layer 22 may be used as the wettability improvement layer as shown in FIG. 3. The metal layer 32 is formed on a flattened portion of the surface of the insulating resin layer 22 by a foil of copper or other metal having a melting point higher than that of the low melting point metal, or by plating such a metal.

If the metallic layer 32 is formed by a plating, part of the surface of the insulating resin layer 22 need not be flattened.

As stated above, the adhesion between the insulating resin layer 22 and the low melting point metal layer 24 can also be enhanced by the formation of the wettability improvement layer on part of the surface of the insulating resin layer 22, having an improved wettability compared with the other surface of the insulating resin layer 22.

The heat conductivity of the low melting point metal forming the low melting point metal layer 24 according to the present invention is at most 80 W/m° K, which can be further enhanced by mixing a metallic powder having a melting point higher than that of the low melting point metal in the low melting point metal layer 24.

The metallic powder used for this purpose is one or a mixture of two or more kinds selected from a group of tungsten (W) powder, molybdenum (Mo) powder, silver (Ag) powder and copper (Cu) powder.

When 50% by weight of a powder of copper (Cu) or tungsten (W) was mixed with a solder alloy of an Sn—Pb type (Sn:Pb=60:40, heat conductivity of about 50 W/m° K), it was found that the heat conductivity of the resultant low melting point metal layer 24 is improved to about 120 W/m° K (when the copper powder is mixed) or about 70 W/m° K (when the tungsten powder is mixed).

In this regard, if a powder of tungsten (W) or molybdenum (Mo) is selected from the above group, the relationship should be preliminarily obtained, through experiments, between an amount of the powder to be added and the resultant Young's modulus because the resultant low melting point metal layer 24 may become brittle due to an excessively high Young's modulus.

The low melting point metal layer 24 containing a powder of tungsten (W) or molybdenum (Mo) has a lower thermal expansion coefficient compared with that formed solely of the low melting point metal. For example, when the tungsten powder of 65% by weight is mixed with a solder alloy of Sn—Pb type (Sn:Pb=63:37, thermal expansion coefficient of about $24 \times 10^{-6}$/°C.), the thermal expansion coefficient of the resultant low melting point metal layer 24 is improved to about $6 \times 10^{-6}$ through $8 \times 10^{-6}$/°C. Thus, thermal and mechanical stress, which may occur due to the difference in the thermal expansion between the semiconductor element 12 and the low melting point metal layer 24, can be reduced to a great extent.

To reduce the thermal expansion coefficient of the low melting point metal layer 24 as described above, instead of the tungsten (W) or molybdenum (Mo) powder, a powder of an inorganic substance having a melting point higher than that of the low melting point metal layer 24 may be added. The inorganic substance powder used therefor is one or more kinds of powders selected from a group of silicon dioxide ($SiO_2$) powder, silicon carbide (SiC) powder, aluminum nitride (AlN) powder, boron nitride (BN) powder and carbon (C) powder.

In this regard, when silicon carbide (SiC) powder, aluminum nitride (AlN) powder, boron nitride (BN) powder and carbon (C) powder are used as the inorganic substance powder, it is possible to maintain or improve the thermal conductivity of the resultant low melting point metal layer 24.

If a metallic powder such as tungsten (W) powder, molybdenum (Mo) powder, silver (Ag) powder, copper (Cu) powder or another powder is mixed in the low melting point metal layer 24, a flux is preferably added thereto for the purpose of improving the wettability of the metallic powder to the low melting point metal. The favorable flux used for a copper powder is of an organic type such as rosin type flux, while that used for a tungsten or molybdenum powder is of an inorganic type such as hydrochloric acid.

However, even if the inorganic type flux such as hydrochloric acid is added to the tungsten or molybdenum powder, the wettability to the low melting point metal is lower than that obtained when the metallic powder such as silver (Ag) powder or copper (Cu) powder is mixed.

Also, when the inorganic substance powder such as silicon dioxide ($SiO_2$) powder, silicon carbide (SiC) powder, aluminum nitride (AlN) powder, boron nitride (BN) powder or carbon (C) powder is mixed with the low melting point metal, it is difficult to improve the wettability of the metallic powder to the low melting point metal solely by the addition of the flux.

Accordingly, when the metallic powder such as tungsten or molybdenum or the inorganic substance powder is used, it is preferable to form a layer of metal having a good wettability to the low melting point metal, such as copper (Cu), gold (Au), titanium (Ti), nickel (Ni) or others, on the surface of a powder particle. Such a metallic layer can be formed through electroless plating, ion plating or flame spraying, or by the use of a coupling agent, or via a mixing dry mill.

However, if a boron nitride (BN) or carbon (C) powder is used, it is difficult to provide a metal layer having a sufficient strength for forming a compact layer 24 of the low melting point metal, whereby such a powder is unsuitable for the purpose of maintaining the air-tight state by coating the semiconductor element 12 with the low melting point metal layer 24.

In this regard, when a metallic powder or a inorganic substance powder having a metallic layer of favorable wettability to the low melting point metal on the particle surface thereof is used, it is also preferable to add a flux to the low melting point metal.

It is possible to improve the electric properties of the mounting structure by electrically connecting the low melting point metal layer 24 thus formed to the grounding circuits of the circuit patterns provided on the mounting surface of the circuit board 10. This electric connection is conducted by electrically connecting the earthing circuits of the circuit patterns 14 formed on the circuit board 10 to the metal layer 28 formed on the surface of the resinous film 26 through via-holes or others, or to a metalized layer formed on the other surface of the semiconductor element 12.

In the mounting structure shown in FIGS. 1 through 3, since the insulating resin layer 22 and the low melting point metal layer 24 are in contact with each other via the wettability improvement layer such as the metallic powder layer 30 or the metal layer 32, both the layers 22, 24 are closely adhered to each other to improve the durability of the mounting structure.

In addition, since the low melting point metal layer 24 is brought into direct contact with the other surface of the semiconductor element 12, it is possible to promptly dissipate heat generated in the semiconductor element 12 to stop the heat being stored in the mounting structure.

When the mounting structure shown in FIGS. 1 through 3 is manufactured, first, each of the connection pads 16 provided, as circuit board side connecting sections, on the mounting surface of the circuit board 10 carrying the semiconductor element 12 is connected to each of the connection terminals 18 provided, as element side connecting sections, on one surface of the semiconductor element 12 opposite to the mounting surface of the circuit board 10, via the conductor patterns 20 of TAB tape formed on the mounting surface of the circuit board 10. Thereafter, to insulate the circuit patterns 14, the resin film 26 made of an insulating resin such as polyimide is provided on the mounting surface of the circuit board 10, except for the connection pads 16.

Then, to seal the joint portion between the connection pad 16 and the connection terminal 18, an insulating resin such as epoxy type resin is filled in a gap between the mounting surface of the circuit board 10 and one surface of the semiconductor element 12 to form the insulating resin layer 22 while exposing the other surface of the semiconductor element 12 therefrom. If an insulating inorganic component such as a filler of silicon dioxide ($SiO_2$) is mixed into the insulating resin, the heat conductivity of the insulating resin layer 22 can be improved.

The resin film 26 may be formed prior to mounting the semiconductor element 12.

Thereafter, the metallic powder layer 30 or the metal layer 32 is formed, as a layer having the improved wettability to a molten low melting point metal such as a solder alloy, on at least part of the exposed surface of the insulating resin layer 22.

The metallic powder layer 30 can be formed by spreading one or more kinds of metallic powders having a melting point higher than that of a metal forming the low melting point metal layer 24, selected from a group of tungsten (W) powder, molybdenum (Mo) powder, silver (Ag) powder and copper (Cu) powder, on the insulating resin layer 22, and curing a insulating resin layer 22 in a heated atmosphere. The metallic layer 32 can also be formed by adhering a foil of metal having a melting point higher than that of the low melting point metal, such as copper, or by plating the same.

Then, the low melting point metal layer 24 is formed by melting a low melting point metal such as a solder alloy to cover the insulating resin layer 22 and the other surface of the semiconductor element 12. One or more kinds of metallic powders having the melting point higher than that of the low melting point metal, selected from a group of tungsten (W) powder, molybdenum (Mo) powder, silver (Ag) powder and copper (Cu) powder are mixed in this low melting point metal to improve the heat conductivity of the low melting point metal layer 24.

Also, in the low melting point metal layer 24, if one or more kinds of inorganic substance powders is mixed, having the melting point higher than that of the low melting point metal, selected from a group of silicon dioxide ($SiO_2$) powder, silicon carbide (SiC) powder, aluminum nitride (AlN) powder, boron nitride (BN) powder and C (carbon) powder, it is possible to minimize the difference in the thermal expansion coefficient between the low melting point metal layer 24 and the semiconductor element 12.

These metallic powders and the inorganic substance powders may be used together.

The electric connection between the semiconductor element 12 and the circuit patterns 14 is made, in the mounting structure stated above, by connecting each of the connection terminals 18 on the semiconductor element 12 to each of the connection pads 16 on the circuit board 10 via the conductor pattern 20 of TAB tape. This connection also may be done by connecting each of connection pads (electrodes of the semiconductor element) on the semiconductor element 12 to each of the connection pads 16 on the circuit board 10 via the conductor pattern 20 of TAB tape, as shown in FIG. 4.

Figure 4:
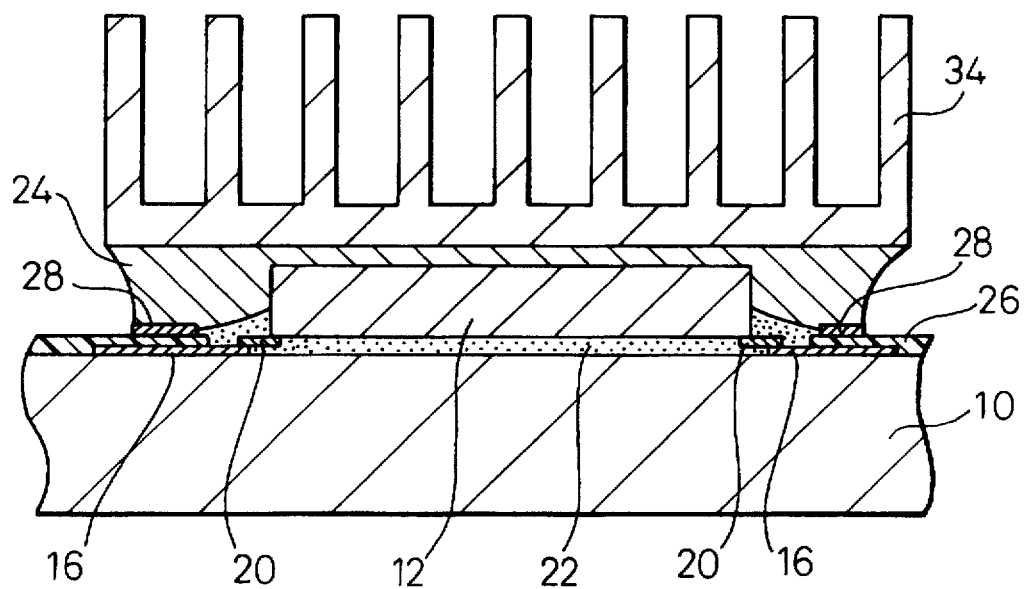
FIGS. 4 through 8 are cross-sectional views showing respective embodiments of this invention.

Further, as shown in FIG. 4, the heat dissipation ability of the mounting structure can be more enhanced by providing a heat radiation fin 34 for accelerating the heat dissipation on the outer surface of the low melting point metal layer 24. The heat radiation fin 34 may be replaced by a heat spreader or a water-cooled channel.

Figure 5:
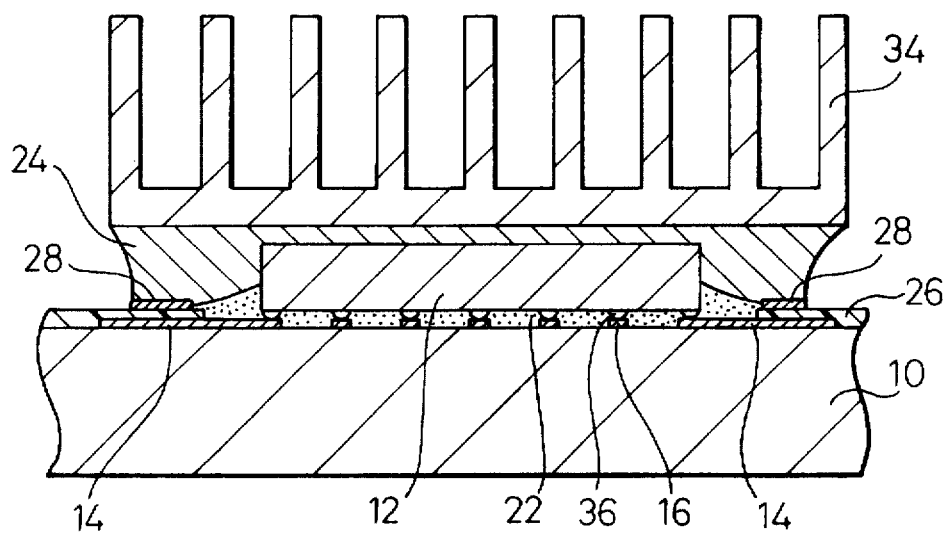

As shown in FIG. 5, the connection between the semiconductor element 12 and the connection pads 16 of the circuit patterns 14 formed on the mounting surface of the circuit board 10 may be made via bumps 36 provided on the one surface of the semiconductor element 12 opposite to the mounting surface of the circuit board 10.

Figure 6:
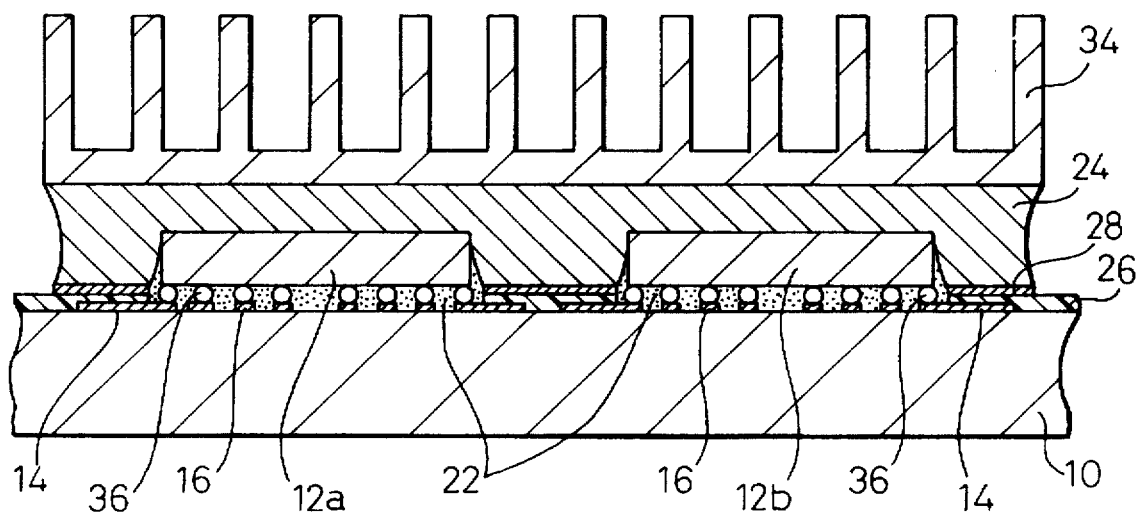

As shown in FIG. 6, it is also possible to mount a plurality of semiconductor elements 12a, 12b on a common circuit board and, after an insulating resin has been filled in a gap between one surface of the respective semiconductor element 12a, 12b and the mounting surface of the circuit board 10 so that insulating resin layers 22 are provided, form a low melting point metal layer 24 using a metal having a low melting point such as a solder alloy while covering the insulating resin layers 22 and the semiconductor elements 12a, 12b. In this case, the heat dissipation ability of the mounting structure can be further enhanced if a heat dissipation member such a heat radiation fin 34 or other is mounted onto the outer surface of the low melting point metal layer 24.

Figure 7:
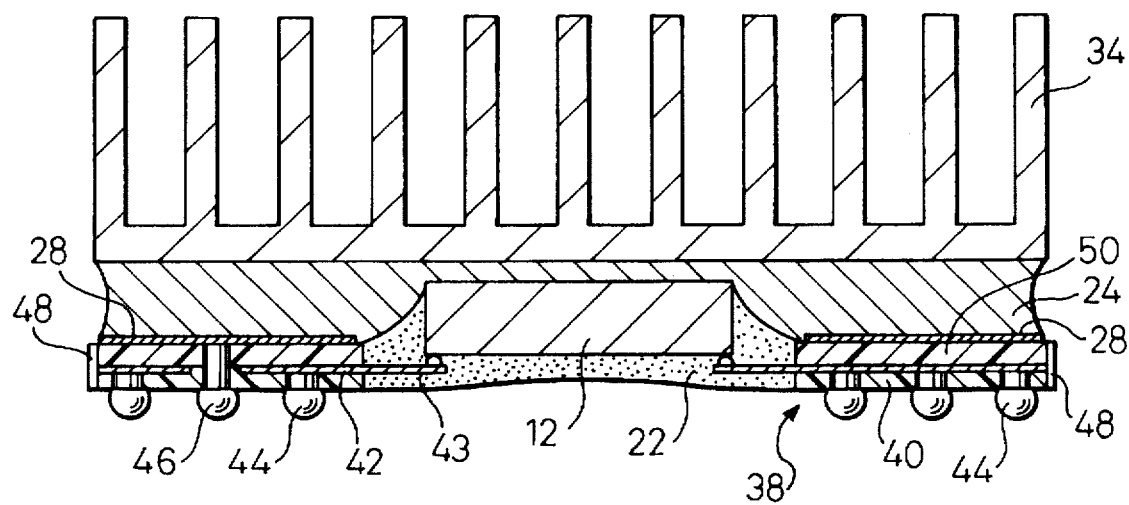

While the above description was made on the mounting structure wherein the semiconductor element 12 is mounted onto the circuit board 10 made of ceramic or plastic, the present invention includes a mounting structure wherein a semiconductor element 12 is mounted on a film type circuit board formed of a TAB tape 38 as shown in FIG. 7.

The TAB tape 38 forming the mounting structure shown in FIG. 7 is a flexible base film 40 such as polyimide or epoxy film, on one surface of which are formed conductor patterns 42, wherein inner leads 43 of the conductor patterns 42 project into a device hole from the periphery thereof, which is formed in the base film in an area corresponding to the semiconductor element 12. A silicon type insulating resin is coated on the mounting surface of the TAB tape 38, on which the semiconductor element 12 is to be mounted, to form a resin film 50, on the upper surface of which a metallic layer 28 is formed.

On the TAB tape 38, a plurality of solder bumps 44 is provided, as connection terminals for external circuits, on the respective connection pads formed in the conductor patterns 42.

In this regard, the end surfaces of the film circuit board are coated with an insulating resin to form resin layers 48 for the purpose of insulating between the conductor patterns 42.

The joint portion between the semiconductor element 12 mounted onto the TAB tape 38 and the inner leads 43 thereof is sealed with an insulating resin layer 22 formed of an insulating resin such as epoxy type resin, but the other surface of the semiconductor element 12 is exposed outside the insulating resin layer 22.

The other surface of the semiconductor element 12 and the insulating resin layer 22 is coated with a low melting point metal layer 24 formed of a metal having a low melting point such as a solder alloy. Both the layers are closely bonded with each other via a metallic powder layer 30 (FIG. 2) or a metal layer (FIG. 3) formed on at least part of the exposed surface of the insulating resin layer 22. Also, the resin film 50 and the low melting point metal layer 24 are closely bonded together via the metal layer 28 formed on the outer surface of the resin film 50 as a wettability improvement layer.

When a further improvement in the heat dissipation ability is desired, a heat dissipating member such as a heat radiation fin 34 may be mounted to the outer surface of the low melting point metal layer 24.

In FIG. 7, the solder bump 46 is connected to the metallic layer 28 formed on the surface of the resinous film 50 of the TAB tape 38 to achieve the connection with the grounding circuit on the circuit board so that the electric properties of the mounting structure are improved.

Figure 8:
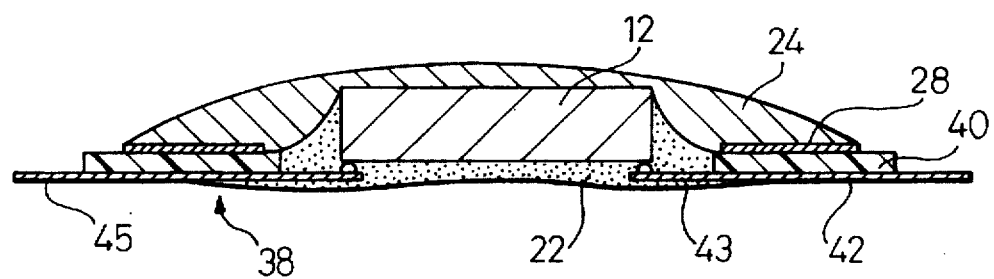

Contrary to the mounting structure shown in FIG. 7 wherein the connection terminals are provided for the connection with the circuit board on which the semiconductor element is mounted, the TAB tape 38 may be used as a chip carrier (board), as shown in FIG. 8. According to a mounting structure shown in FIG. 8, the TAB tape 38 carries conductor patterns 42 on one surface of the base film 40. The conductor pattern 42 of the TAB tape 38 has an inner lead 43 projecting into a device hole provided on the base film 40 in an area corresponding to a semiconductor element 12 to be mounted thereon, and an outer lead 45 extending outside from the base film 40.

A joint portion of the semiconductor element 12 mounted onto the TAB tape 38 with the inner lead 43 thereof is sealed with an insulating resin layer 22 formed of an insulating resin such as epoxy type resin, but the other surface of the semiconductor element 12 is exposed outside the insulating resin layer 22.

The other surface of the semiconductor element 12 and the insulating resin layer 22 are coated with a low melting metal layer 24 formed of a metal having a low melting point such as a solder alloy. Both the layers are closely bonded with each other via a metallic powder layer 30 (FIG. 2) or a metal layer (FIG. 3) formed on at least part of the exposed surface of the insulating resin layer 22. Also, the base film 40 and the low melting point metal layer 24 are closely bonded together via the metal layer 28 formed on the outer surface of the base film 50.

While the other surface of the semiconductor element 12 mounted onto the circuit board 10 is exposed from the insulating resin layer 22 in the mounting structures shown in FIGS. 1 through 8, this surface may be coated with the insulating resin layer 22.

Figure 9:
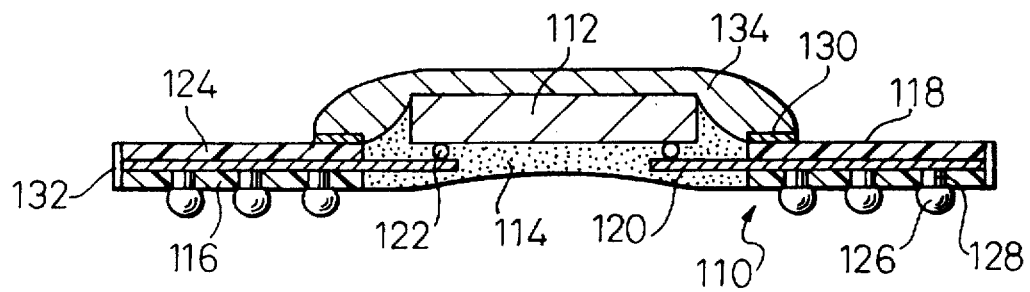
FIG. 9 is a cross-sectional view of a semiconductor chip mount structure using a flexible base film according to an embodiment of the present invention.

FIG. 9 shows a further embodiment of a semiconductor chip mounting structure according to the present invention. In the structure shown in FIG. 9, a semiconductor element 112 is mounted onto one surface (mounting surface) of a film type circuit board 110 at a position of a device hole provided thereon, and inner leads 120 of the circuit board, provided to project into the device hole as a circuit board side connecting section, are electrically connected to gold bumps 122 provided, as an element side connecting section, on a surface of the semiconductor element 12 opposite to the mounting surface. The joint portion between the circuit board side connecting section and the element side connecting section is sealed with an insulating resin layer 114. In this embodiment, the other surface of the semiconductor element 112 is exposed from the insulating resin layer 114.

The connection between the circuit board side connecting section and the element side connecting section is made by connecting the inner lead 120 to the gold bump 122 formed on one surface of the semiconductor element 112, which inner lead projects into the device hole while forming part of conductor patterns 118 on one surface of a flexible film 116 constituting the circuit board 110. On the other surface of the flexible film 116, solder balls (solder bumps) 126, provided as external connection terminals, are connected to the conductor patterns 118 through via holes 128 penetrating the flexible film 116. Resin layers 132, like the layers 48 described above, are shown at the end surfaces of the circuit board 110.

The conductor patterns 118 are coated, except for the inner leads 120, with an insulating resin film 124 formed of an insulating resin such as silicone resin, and a metal layer 130 is provided on the surface of the resin film 124 in the peripheral area of the device hole, in which the semiconductor element 112 is carried, by a metallic foil such as copper or by a plating.

As the film type circuit board 110 used in this embodiment, a TAB tape may be used, wherein the semiconductor element can be mounted on one ends of the conductor patterns 118 formed on one surface of a flexible film.

As the insulating resin for forming the insulating resin layer 114, those conventionally used for sealing semiconductor elements can be adopted, such as an epoxy type. Preferably, an insulating inorganic substance such as silicon dioxide ($SiO_2$) is mixed as a filler so that the heat conductivity of the insulating resin layer 24 is improved.

Figure 10:
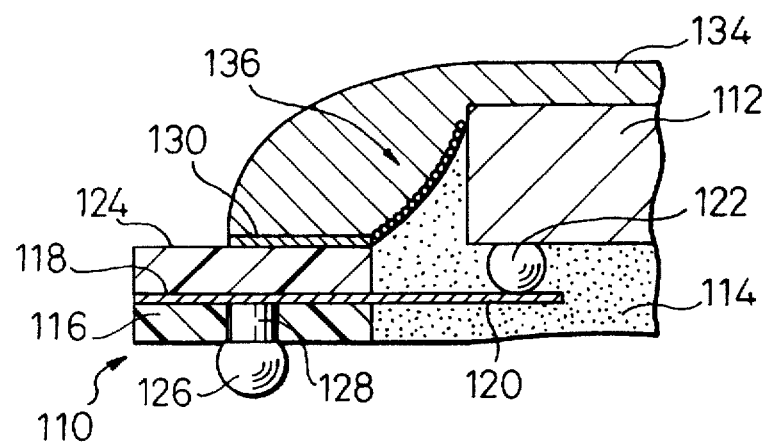
FIG. 10 is a partial enlarged view of FIG. 9, particularly showing a wetting characteristic improved layer.
Figure 11:
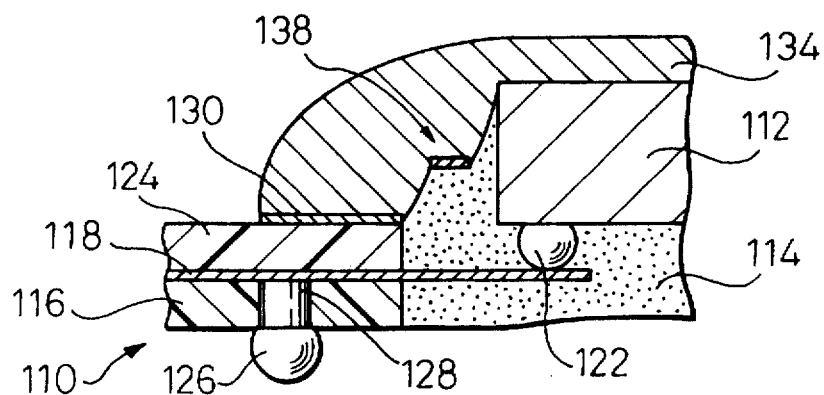
FIG. 11 is a partial enlarged view corresponding to FIG. 10, but showing another embodiment using a flexible base film of this invention.

While the film type circuit board 110 used in the embodiment shown in FIGS. 9 through 11 has the circuit patterns 118 on one surface (on which the semiconductor element 112 is mounted) of the flexible film 116, the circuit patterns 118 may be provided on the other surface (opposite to the surface on which the semiconductor element 112 is mounted). In the latter case, the external terminals such as solder bumps are attached by forming via-holes in a layer of resin such as silicone resin covering the conductor patterns 118 provided on the other surface of the flexible film 116 so that the conductor patterns 118 are exposed on the bottom thereof, and inserting the solder bumps into the via-holes.

In this regard, the operation and constitutions other than the above are similar to the embodiment shown in FIGS. 1 through 3.

Figure 12:
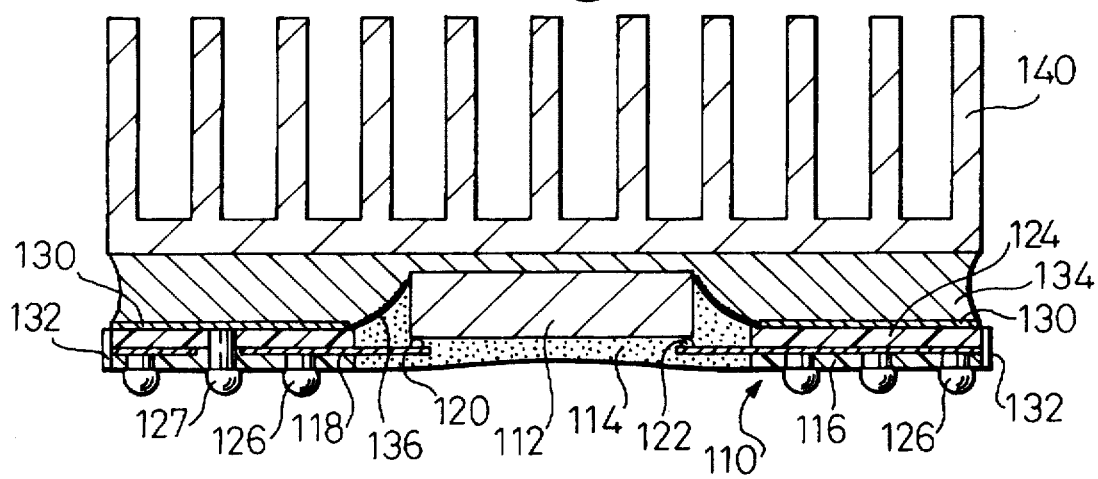
FIGS. 12 through 17 are cross-sectional views showing respective embodiments using a flexible base film of this invention.

The heat dissipation ability of the semiconductor device is further enhanced by mounting a heat radiation fin 140 as shown in FIG. 12 on the outer surface of the low melting point metal layer 134 shown in FIGS. 9 through 11. In place of the heat radiation fin 140, a heat spreader or a water-cooled channel may be used as means for dissipating heat.

Also, the electric property of the semiconductor device can be more improved by connecting a metal layer 130 in contact with a low melting point metal layer 134 to a solder ball 127 through a via-hole 129 penetrating a flexible film 116 and a resin film 124 so that the solder ball 127 is connected to a grounding pattern on the circuit board.

Figure 13:
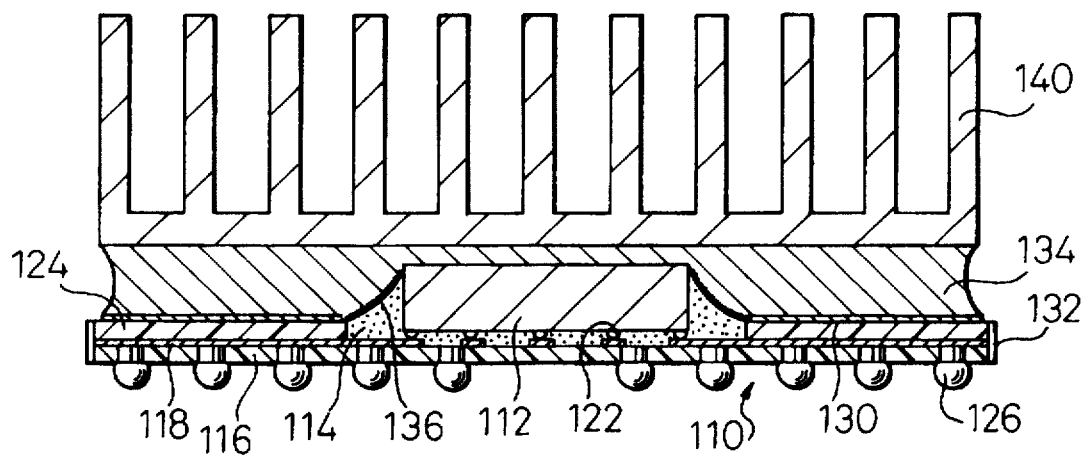

A so-called area TAB tape may be used as the TAB tape for constituting the film type circuit board 110, wherein conductor patterns to be connected to the solder bumps 122 on the semiconductor element 112 are formed on a common surface of the flexible film 116, as shown in FIG. 13.

Figure 14:
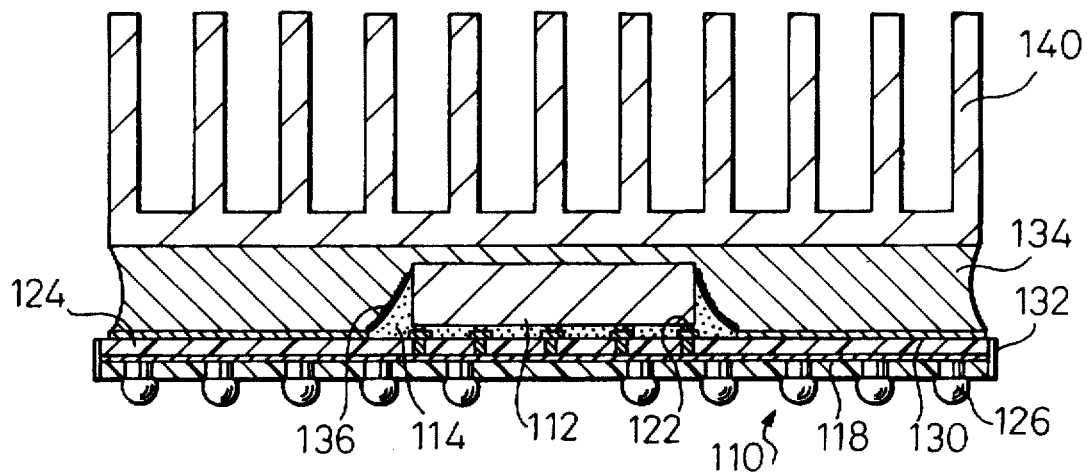

A so-called dual metal type TAB tape may be used as the above-mentioned area TAB tape, wherein conductor patterns are formed not only on one surface of the flexible film 116 on which the semiconductor element 112 is to be mounted, but also on the other surface thereof, as shown in FIG. 14.

Figure 15:
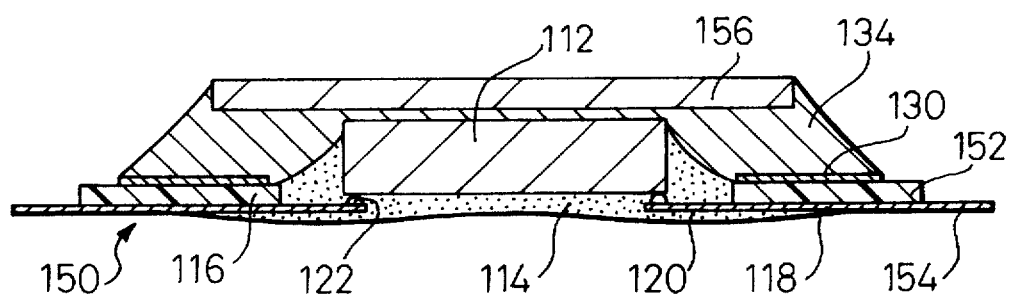
Figure 16:
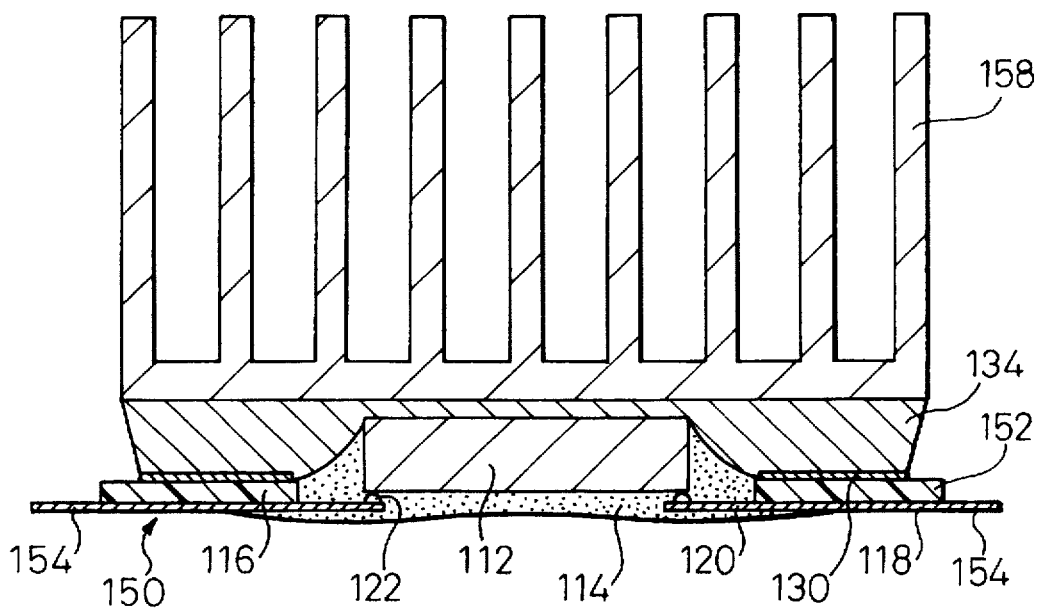

To further improve the heat dissipation ability of the semiconductor element shown in FIG. 8, a heat spreader 156 may be provided on the outer surface of the low melting point metal layer 134, as shown in FIG. 15, which also includes a flexible base film 152; or a heat radiation fin 158 may be provided, as shown in FIG. 16.

Figure 17:
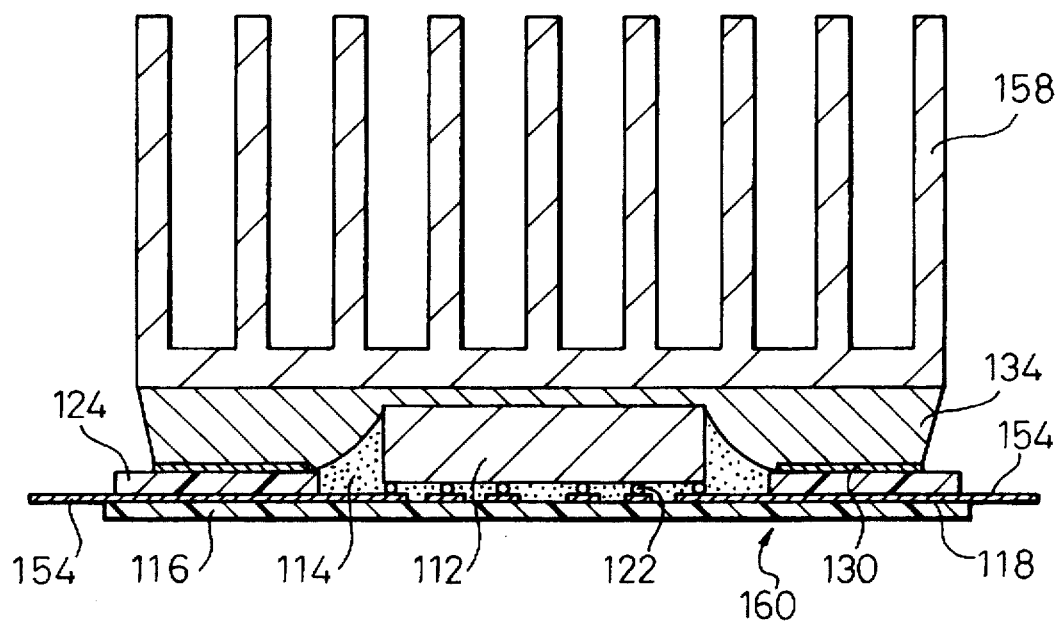
Figure 18:
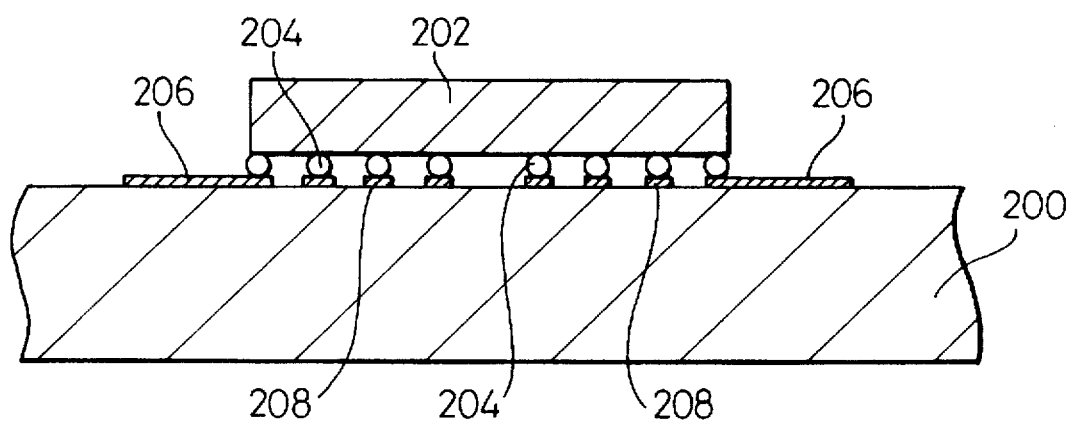
FIGS. 18 and 19 are cross-sectional views showing a semiconductor chip mount structure known in the prior art.
Figure 19:
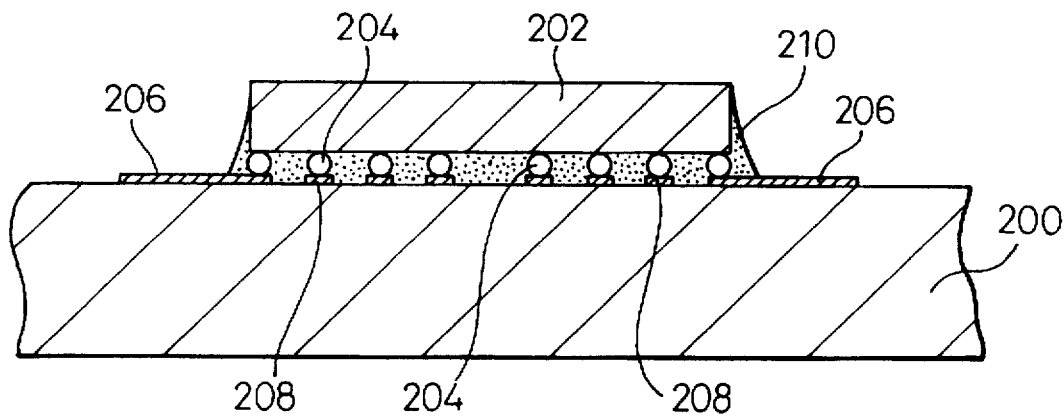

Instead of the TAB tape 150 used in the embodiments shown in FIGS. 15 and 16 an area TAB tape 160 shown in FIG. 17 may be used. The area TAB tape 160 has conductor patterns 118, each of which is formed on one surface of a flexible film and has a mounting pad to be connected to a gold bump 122 of the semiconductor element 112.

The tape is insulated from outside by a resin layer 124 formed, for example, of polyimide resin, except for an area wherein the semiconductor element 112 is mounted and the outer leads 154.

The TAB tape is used, in the embodiment shown in FIGS. 9 and 10, as a semiconductor element-mounting film having film side connecting sections provided on one surface of a flexible film 116 for the electric connection with element side connecting sections provided on one surface of the semiconductor element 112 to be mounted. The TAB tape usable for this purpose preferably has such a structure that a metal layer 130 is formed, as a layer capable of being closely bonded with the low melting point metal layer 134, at the periphery of a semiconductor element-mounting zone on a surface in contact with a low melting point metal layer 114 coating the mounted semiconductor element 110.

Such a metal layer 134 can be provided by adhering a metallic foil or plating a metal such as copper on the surface of the flexible film 116 of the TAB tape or the surface of a resin layer 124 formed of an insulating resin such as silicone resin for partly insulating the conductive patterns 118.

The present invention will be described in more detail based on the following Examples.

EXAMPLE 1

Polyimide resin was coated on a surface of a circuit board 10 made of alumina to form an insulating resin film 26, except for connection pads 16 of circuit patterns 14.

In addition, after a chromium layer has been formed on the resin film 26 by a sputtering, a copper layer, a nickel layer and a gold layer were sequentially provided by a plating on the chromium layer so that a metal layer 28 (wettability improvement layer) having an uppermost gold layer was formed.

Then, the outer leads of the conductor patterns 20 of the TAB tape were connected to the connection pads 16 of the circuit patterns 14, and a semiconductor element 12 of a 16 mm square having a metalized layer of nickel-gold on the back surface thereof was mounted on inner leads of conductor circuits 20 of the TAB tape. Thus, connection terminals 18 provided on one surface of the semiconductor element 12 opposite to the circuit board were connected to the inner leads of the conductor patterns 20.

The joint portions between the connection terminals 18 of the semiconductor element 12 mounted onto the circuit board 10 and the connection pads 16 of the circuit patterns 14 were sealed with bisphenolic type epoxy resin containing silicon dioxide ($SiO_2$) filled in a gap between the one surface of the semiconductor element 12 and the mounting surface of the circuit board 10. The other surface (back surface) of the semiconductor element 12 was exposed from the thus-formed insulating resin layer 22 of epoxy resin.

After a copper powder was spread onto the surface of the insulating resin layer 22, the insulating resin surface 22 was cured in a heated atmosphere to form a metallic powder layer 30 formed of the copper powder bonded to the surface of the insulating resin layer 22.

Then, the insulating resin layer 22 and the other surface of the semiconductor element 12 were coated with a solder paste of Sn—Pb type (Sn:Pb=63:37). The solder paste contains a tungsten powder (of about 65% by weight) having a particle size of 80 to 100 mesh, each particle thereof having a surface layer of nickel provided through an electroless plating, and a rosin type flux added to improve the wettability to the tungsten powder.

After placing a heat radiation fin 34 of aluminum having a nickel/gold plated layer on a surface to be in contact with the solder paste (back surface), the circuit 10 was loaded as a whole into a reflow furnace to be subjected to a reflow treatment at 250° C. for 30 seconds.

The semiconductor device removed from the reflow furnace had a compact low melting point metal layer 24 formed of the solder, completely coating the semiconductor element 12 and the insulating resin layer 22, and the heat radiation fin 34 bonded thereto.

It was confirmed from the heat cycle test that the adhesion of the low melting point metal layer 24 with the insulating resin layer 22 or others in the resultant semiconductor device was favorable, and also the heat dissipation ability was favorable.

EXAMPLE 2

A metal layer 28 was formed in the peripheral area on the surface of a circuit board 10 made of BT resin on which a semiconductor element 12 is to be mounted, which metal layer is formed of a copper foil connected via a through-hole to an earthing layer provided in the circuit board 10. Thereafter, a nickel-gold plated layer was formed on circuit patterns 14 provided on the surface of the circuit board.

Then, the 10 mm square semiconductor element 12 having solder bumps 36 provided, as connection terminals, on one surface thereof and a metalized layer of nickel-gold on the other surface thereof, was mounted onto the circuit board 10. The semiconductor element 12 thus mounted was bonded by a so-called flip chip system wherein the solder bumps 36 of the semiconductor element 12 are directly connected to connection pads 16 of the circuit patterns 14.

Further, a bisphenolic type epoxy resin containing silicon dioxide ($SiO_2$) was filled in a gap between the one surface of the semiconductor element 12 and the mounting surface of the circuit board 10 to seal the joint portions between the solder bumps 36 and the connection pads 16 of the circuit patterns 14. The other surface (back surface) of the semiconductor element 12 was exposed outside an insulating resin layer 22 thus formed by the epoxy resin.

After a copper powder was spread onto the surface of the insulating resin layer 22, the insulating resin surface 22 was cured in a heated atmosphere to form a metallic powder layer 30 formed of the copper powder bonded to the surface of the insulating resin layer 22.

Then, the insulating resin layer 22 and the other surface of the semiconductor element 12 were coated with a solder paste of Sn—Pb type (Sn:Pb=63:37). The solder paste contains a tungsten powder (of about 65% by weight) having a particle size of 80 to 100 mesh, each particle thereof having a surface layer of nickel provided through an electroless plating, and a rosin type flux added to improve the wettability of the tungsten powder.

After placing a heat radiation fin 34 of aluminum having a nickel/gold plated layer on a surface to be in contact with the solder paste (back surface), the circuit 10 was loaded as a whole into a reflow furnace to be subjected to a reflow treatment at 250° C. for 30 seconds.

The semiconductor device removed from the reflow furnace had a compact low melting point metal layer 24 formed of the solder, completely coating the semiconductor element 12 and the insulating resin layer 22, and the heat radiation fin 34 bonded thereto.

It was confirmed from the heat cycle test that the adhesion of the low melting point metal layer 24 with the insulating resin layer 22 or other in the resultant semiconductor device was favorable, and the heat dissipation ability was also favorable.

EXAMPLE 3

A TAB tape formed of a flexible film 116 of polyimide resin was used, on one surface of which are formed conductor patterns 118 so that inner leads 120 thereof project into a device hole provided on the flexible film 116. On the other surface of the flexible film 116, terminal pads are formed for providing bumps (solder balls) for the connection with a mounted circuit board (not shown).

An insulating resin film 124 was formed all over one surface of the TAB tape, except for the device hole, by screen-printing a silicon type elastomer paste. Thereafter, a 70 μm thick copper foil was placed on the insulating resin layer 124. The TAB tape was cured to form a metal layer 130 bonded to the insulating resin film 124. The curing was conducted at 150° C. for 2 hours.

Electrodes provided on one surface of a semiconductor element 112 of 15 mm square were connected to the inner leads 120 of the TAB tape thus formed by a single bonding method.

In this regard, this semiconductor element 112 had a metalized layer of gold on the other surface thereof.

Then, joint portions between the TAB tape and the semiconductor element 112 were sealed with an insulating resin layer 114 formed of a silicon type potting agent. After a copper powder was spread on the surface of the insulating resin layer 114, the insulating layer 114 was cured in a dry nitrogen atmosphere at 150° C. for one hour to form a metallic powder layer 136 bonded onto the insulating resin layer 114. The back surface of the semiconductor element 112 was exposed from the insulating resin layer 114.

A solder paste layer was formed on the back surface of the semiconductor element 112 mounted to the TAB tape by coating an eutectic Sn—Pb type solder paste containing a tungsten powder at 65% by weight, having a particle size of 80 to 100 mesh, each particle thereof having a surface layer of nickel provided through an electroless plating, and a heat radiation fin of aluminum alloy was placed on the solder paste layer, which fin has a gold film, provided by sputtering, on the bottom surface.

A flux was coated on the terminal pads while disposing the flexible film 116 on the upper side, and solder balls of eutectic Sn—Pb type were arranged on the terminal pads. After being dried, the assembly was subjected to a reflow treatment in a dry nitrogen atmosphere at 250° C. for one minute.

The semiconductor device resulted from the reflow treatment was of a type shown in FIG. 12, wherein the low melting point metal layer 134 covering the semiconductor element 112 and the insulating resin layer 114 is closely bonded to the semiconductor element 112, the insulating resin layer 114 and the resin film 124 via the metalized layer of gold provided on the other surface of the semiconductor element 112, a metallic powder layer 136 on the insulating resin layer 114 and the metal layer 130 adhered to the resin film 124. As an alternate to the metallic powder layer 136, a metal layer 138 (FIG. 11), like metal layer 32, could be used. It was confirmed from the heat cycle test or other that the durability and the heat dissipation ability of the resultant semiconductor device are favorable.

EXAMPLE 4

An area TAB tape formed of a flexible film 116 of polyimide resin was used, on one surface of which were formed conductor patterns 118, each having a pad for the connection with a solder bump 122 on a semiconductor element 112. On the other surface of the flexible film 116, terminal pads were formed for providing bumps (solder balls) for the connection with a mounted circuit board.

An insulating resin film 124 was formed all over one surface of the TAB tape, except for an area on which the semiconductor element 112 is to be mounted, by coating an epoxy type prepreg. Thereafter, a 35 μm thick copper foil was placed on the insulating resin film 124 and heat-pressed to form a metal layer 130 bonded to the insulating resin film 124. The heat-pressing was conducted at 180° C. under the pressure of 30 kg/cm$^2$.

The 15 mm square semiconductor element 112 was mounted onto the mounting surface of the area TAB tape thus obtained by a flip chip bonding method wherein solder bumps 122 formed on one surface of the semiconductor element 112 are directly connected to the conductor patterns provided on the mounting surface of the area TAB tape.

In this regard, this semiconductor element 112 had a metalized layer of nickel/gold on the other surface thereof.

Then, joint portions between the area TAB tape and the semiconductor element 112 were sealed with an insulating resin layer 114 formed of an epoxy type potting agent. After a copper powder was spread on the surface of the insulating resin layer 114, the insulating layer 114 was cured in a dry nitrogen atmosphere at 150° C. for one hour to form a metallic powder layer 136 bonded onto the insulating resin layer 114. The back surface of the semiconductor element 112 was exposed outside the insulating resin layer 114.

A solder paste layer was formed on the back surface of the semiconductor element 112 mounted to the area TAB tape by coating an eutectic Sn—Pb type solder paste containing a copper powder of 50% by weight, having a particle size of 100 mesh, and a heat radiation fin of aluminum alloy was placed on the solder paste layer, which fin has a nickel/gold film, provided by a sputtering, on the bottom surface.

A flux was coated on the terminal pads while disposing the flexible film 116 on the upper side, and solder balls of eutectic Sn—Pb type were arranged on the terminal pads. After being dried, the assembly was subjected to a reflow treatment in a dry nitrogen atmosphere at 230° C. for one minute.

The semiconductor device resulting from the reflow treatment was of a type shown in FIG. 13, wherein the low melting point metal layer 134 covering the semiconductor element 112 and the insulating resin layer 114 is closely bonded to the semiconductor element 112, the insulating resin layer 114 and the resin film 124 via the metalized layer of nickel/gold provided on the other surface of the semiconductor element 112, the metallic powder layer 136 on the insulating resin layer 114 and the metal layer 130 adhered to the resin layer 124. It was confirmed from the heat cycle test or other that the durability and the heat dissipation ability of the resultant semiconductor device are favorable.

EXAMPLE 5

A TAB tape formed of a flexible film 116 of polyimide resin having a thickness of 75 μm was used, wherein conductor patterns 118 of a copper foil having a thickness of 25 μm are formed on one surface thereof, and each of the conductor patterns has an inner lead 120 projecting into a device hole of an annular square shape provided in a central area of the flexible film 116 and an outer lead 154 projecting outside from the periphery of the flexible film 116.

Along the peripheral edge of the device hole, an annular square-shaped copper foil having a thickness of 25 μm was adhered on the other surface of the TAB tape, which was then plated with gold to form a metal layer 130.

Then, all bumps provided on one surface of an 11 mm square semiconductor element 112 were connected to the inner leads 120 on the TAB tape. The joint portions between the semiconductor element 112 and the inner leads 120 on the TAB tape were sealed with an insulating resin layer 114 formed of a solvent type potting agent of bisphenolic epoxy type. Then, after a copper powder was spread on the surface of the insulating resin layer 114, the insulating resin layer 114 was cured in a dry nitrogen atmosphere at 150° C. for one hour so that the copper powder is closely adhered to the insulating resin layer 114 to form a metallic powder layer 136. In this regard, the back surface of the semiconductor element 112 was exposed outside the insulating resin layer 114.

A solder paste layer was formed on the back surface of the semiconductor element 112 mounted to the area TAB tape by coating an eutectic Sn—Pb type solder paste containing a copper powder at 50% by weight, having a particle size of 100 mesh, and a heat radiation fin of aluminum alloy was placed on the solder paste layer, which fin has a nickel/gold film provided by sputtering on the bottom surface.

A flux was coated on the terminal pads while disposing the flexible film 116 on the upper side, and solder balls of eutectic Sn—Pb type were arranged on the terminal pads. After being dried, the assembly was subjected to a reflow treatment in a dry nitrogen atmosphere at 230° C. for one minute.

The semiconductor device resulting from the reflow treatment was of a type shown in FIG. 16, wherein the low melting point metal layer 134 covering the semiconductor element 112 and the insulating resin layer 114 is closely bonded to the semiconductor element 112, the insulating resin layer 114 and the flexible film 116 via the metalized layer of nickel/gold provided on the other surface of the semiconductor element 112, the metallic powder layer 136 on the insulating resin layer 114 and the metal layer 130 adhered to the resin layer 124. It was confirmed from the heat cycle test or others that the durability and the heat dissipation ability of the resultant semiconductor device are favorable.

EXAMPLE 6

An area TAB tape formed of a flexible film 116 of polyimide resin having a thickness of 35 μm was used, wherein conductor patterns to be connected to solder bumps 122 provided, as connection terminals, on one surface of a semiconductor element 112 are formed on the same surface as conductor patterns 118 of the flexible film 116.

A 35 μm thick annular square-shaped copper foil was placed on the periphery of an area of the area TAB tape element 112 (on the surface on which the conductor patterns 118 are provided) for mounting the semiconductor element 112, via a resin film 124 formed of a 60 μm thick epoxy type prepreg layer. Thereafter, the copper foil was bonded to the resin layer 124 by a heat-pressing to form a metal layer 130. The heat-pressing was conducted at 180° C. under a pressure of 30 kg/cm².

The 11 mm square semiconductor element 112 was mounted onto the mounting area of the area TAB tape by a flip-chip bonding method wherein solder bumps 122 provided on one surface of the semiconductor element 112 are directly connected to the conductor patterns formed on the mounting surface of the area TAB tape.

In this regard, on the other surface (back surface) of the semiconductor element 112, a metalized layer of nickel/gold was formed.

Then, the joint portions between the area TAB tape and the semiconductor element 112 were sealed with an insulating resin layer 114 formed of a solvent type potting agent of a bisphenolic epoxy type. Then, after a copper powder was spread on the surface of the insulating resin layer 114, the insulating resin layer 114 was cured in a dry nitrogen atmosphere at 150° C. for one hour so that the copper powder closely adhered to the insulating resin layer 114 to form a metallic powder layer 136. In this regard, the back surface of the semiconductor element 112 was exposed outside the insulating resin layer 114.

A solder paste layer was formed on the back surface of the semiconductor element 112 mounted to the area TAB tape by coating an eutectic Sn—Pb type solder paste containing a tungsten powder at 60% by weight, having a particle size of 80 to 100 mesh, each particle thereof having a surface layer of nickel provided through electroless plating, and a heat radiation fin of aluminum alloy was placed on the solder paste layer, which fin has a nickel/gold film provided by a sputtering on the bottom surface.

Thereafter, the area TAB tape carrying the semiconductor element 112 thereon was subjected to a reflow treatment in a dry nitrogen atmosphere at 230° C. for one minute.

The semiconductor device resulting from the reflow treatment was of a type, shown in FIG. 17, wherein the low melting point metal layer 134 covering the semiconductor element 112 and the insulating resin layer 114 is closely bonded to the semiconductor element 112, the insulating resin layer 114 and the resin film 124 via the metalized layer of nickel/gold provided on the other surface of the semiconductor element 112, the metallic powder layer 136 on the insulating resin layer 114 and the metal layer 130 adhered to the resin layer 124. It was confirmed from the heat cycle test or other that the durability and the heat dissipation ability of the resultant semiconductor device are favorable.

It should be understood by those skilled in the art that the foregoing description relates to only some preferred embodiments of the disclosed invention, and that various changes and modifications may be made to the invention without departing from the spirit and scope thereof.

We claim:

1. A semiconductor chip mount structure comprising:
   a substrate having a base surface on which base side connectors are formed;
   a semiconductor chip mounted on said base surface of the substrate, said semiconductor chip having chip side connectors on a first surface thereof facing said base surface of the substrate, said chip side connectors being electrically connected to said base side connectors;
   an insulating resin layer covering said chip side connectors and said base side connectors;
   a metal layer, including a metal having a melting point lower than a temperature at which circuits or other components of said semiconductor chip may be thermally destroyed, covering said semiconductor chip and said insulating resin layer; and
   a wetting characteristic improving layer formed along at least a part of a contact surface between said metal layer and said insulating resin layer.

2. A semiconductor chip mount structure as set forth in claim 1, wherein said metal layer also covers at least a part of said base surface of the substrate and a second wetting characteristic improving layer is formed along at least a part of a second contact surface between said metal layer and said base surface of the substrate.

3. A semiconductor chip mount structure as set forth in claim 1, wherein said semiconductor chip has a second surface which is exposed outside said insulating resin layer but is covered by said metal layer.

4. A semiconductor chip mount structure as set forth in claim 3, wherein a heat radiation member is provided on said metal layer adjacent to said second surface of the semiconductor chip.

5. A semiconductor chip mount structure as set forth in claim 1, wherein said metal layer includes a low melting point metal which melts at a temperature lower than 450°.

6. A semiconductor chip mount structure as set forth in claim 1, wherein said metal layer includes a low melting point base metal and metal powder, wherein said metal powder is mixed in said base metal and has a melting point higher than said base metal.

7. A semiconductor chip mount structure as set forth in claim 6, wherein said metal powder is one or a mixture of two or more selected from a group consisting of tungsten (W) powder, molybdenum (Mo) powder, silver (Ag) powder and copper (Cu) powder.

8. A semiconductor chip mount structure as set forth in claim 1, wherein said metal layer includes a base metal and an inorganic powder, mixed in said base metal, and has a melting point higher than said base metal.

9. A semiconductor chip mount structure as set forth in claim 8, wherein said inorganic powder is one or more selected form a group consisting of silicon dioxide ($SiO_2$) powder, silicon carbide (SiC) powder, aluminum nitride (AlN) powder, boron nitride (BN) powder and carbon (C) powder.

10. A semiconductor chip mount structure as set forth in claim 1, wherein said insulating resin layer comprises an insulating inorganic powder.

11. A semiconductor chip mount structure as set forth in claim 1, wherein said wetting characteristic improving layer is a metal powder or metal foil layer attached onto said insulating resin layer which is in contact with said metal layer.

12. A semiconductor chip mount structure as set forth in claim 11, wherein said metal powder or metal foil layer includes a metal having a melting point higher than said melting point of the metal layer.

13. A semiconductor chip mount structure as set forth in claim 2, wherein said second wetting characteristic improving layer is a metal powder or metal foil layer attached onto said base surface of the substrate which is in contact with said metal layer.

14. A semiconductor chip mount structure as set forth in claim 13, wherein said metal powder or metal foil layer includes a metal having a melting point higher than said melting point of the metal layer.

15. A semiconductor chip mount structure as set forth in claim 1, wherein said base side connectors formed on said base surface of the substrate comprise at least one ground pattern and said metal layer is electrically connected to said ground pattern.

16. A semiconductor chip mount structure as set forth in claim 1, wherein said chip side connectors are electrically connected to said base side connectors by connecting terminals mounted on said semiconductor chip.

17. A semiconductor chip mount structure as set forth in claim 1, wherein said chip side connectors are electrically connected to said base side connectors by a tape automated bonding tape having a conductive pattern.

18. A semiconductor chip mount structure as set forth in claim 1, wherein a plurality of semiconductor chips is mounted on said base surface of the substrate, and each of said semiconductor chips has respective said chip side connectors which are electrically connected to said base side connectors, said insulating resin layer covers said chip side connectors and said base side connectors, and said metal layer covers said insulating resin layer and said plurality of semiconductor chips.

19. A semiconductor chip mount structure as set forth in claim 1, wherein said substrate having said base surface on which said base side connectors are formed comprises a flexible film.

20. A process for mounting a semiconductor chip, having chip side connectors on a first surface thereof, on a substrate having a base surface on which base side connectors are formed, said process comprising the following steps of:
   mounting said semiconductor chip on said base surface of the substrate, so that said chip side connectors of said semiconductor chip are electrically connected to said base side connectors;
   filling an insulating resin into a gap between said base surface of the substrate and said first surface of the semiconductor chip to form an insulating resin layer which covers said chip side connectors and said base connectors;
   forming a wetting characteristic improving layer on at least a part of an exposed surface of said insulating resin layer, a wetting characteristic of said wetting characteristic improving layer with respect to a low melting point metal layer being at least better than that of said insulating resin layer; and
   forming said metal layer of a metal having a melting point lower than a temperature at which circuits or other components of said semiconductor chip may be thermally destroyed, for covering said semiconductor chip and said insulating resin layer.

21. A process for mounting a semiconductor chip, having chip side connectors on a first surface thereof, on a substrate having a base surface on which base side connectors are formed, said process comprising the following steps of:

mounting said semiconductor chip on said base surface of the substrate, so that said chip side connectors of said semiconductor chip are electrically connected to said base side connectors;

filling an insulating resin into a gap between said base surface of the substrate and said first surface of the semiconductor chip to form an insulating resin layer which covers said chip side connectors and said base side connectors;

forming first and second wetting characteristic improving layers on at least a part of an exposed surface of said insulating resin layer and on at least a part of said base surface of the substrate, respectively, a wetting characteristic of said first and second wetting characteristic improving layers with respect to first and second low melting point metal layers being at least better than that of said insulating resin layer and said base surface of the substrate, respectively;

forming said first and second metal layers of a metal having a melting point lower than a temperature at which circuits or other components of said semiconductor chip may be thermally destroyed, for covering said semiconductor chip, said insulating resin layer and said base surface of the substrate.

22. A semiconductor chip as set forth in claim 4, wherein the heat radiation member comprises a heat spreader.

23. A semiconductor chip as set forth in claim 4, wherein the heat radiation member comprises a fin member.

24. A semiconductor chip as set forth in claim 5, wherein the low melting point metal comprises solder.

25. A semiconductor chip as set forth in claim 10, wherein said insulating inorganic powder comprises silicon dioxide ($SiO_2$).

26. A semiconductor chip as set forth in claim 16, wherein said connecting terminals comprise solder bumps.

27. A semiconductor chip mount structure, comprising:

a substrate having a base surface on which a first connector is formed;

a semiconductor chip mounted on said base surface, said semiconductor chip having a second connector on a first surface thereof facing said base surface, said second connector being electrically connected to said first connector;

an insulating resin layer covering at least a portion of said first and second connectors;

a metal layer, including a metal having a melting point lower than a temperature at which circuits or other components of said semiconductor chip may be thermally destroyed, and covering at least a portion of said semiconductor chip and said insulating resin layer; and a wetting characteristic improving layer formed along at least a part of a contact surface between said metal layer and said insulating resin layer.

28. A process for mounting a semiconductor chip, having a first connector on a first surface thereof, on a substrate having a base surface on which a second connector is formed, said process comprising the steps of:

mounting said semiconductor chip on said base surface, so that said first connector is electrically connected to said second connector;

filling an insulating resin into a gap formed between said base surface and said first surface of the semiconductor chip to form an insulating resin layer which covers at least a portion of said first and second connectors;

forming a wetting characteristic improving layer on at least a portion of said insulating resin layer, a wetting characteristic of said wetting characteristic improving layer with respect to a low melting point metal layer being at least better than that of said insulating resin layer; and forming said metal layer including a metal having a melting point lower than a temperature at which circuits or other components of said semiconductor chip may be thermally destroyed, for covering at least a portion of said semiconductor chip and said insulating resin layer.

29. A process for mounting a semiconductor chip, having a first connector on a first surface thereof, on a substrate having a base surface on which a second connector is formed, said process comprising the steps of:

mounting said semiconductor chip on said base surface, so that said first connector is electrically connected to said second connector;

filling an insulating resin into a gap formed between said base surface and said first surface of the semiconductor chip to form an insulating resin layer which covers at least a portion of said first and second connectors;

forming first and second wetting characteristic improving layers on at least a portion of said insulating resin layer and on at least a portion of said base surface, respectively, a wetting characteristic of said first and second wetting characteristic improving layers with respect to first and second low melting point metal layers being at least better than that of said insulating resin layer and said base surface, respectively;

forming said first and second metal layers including a metal having a melting point lower than a temperature at which circuits or other components of said semiconductor chip may be thermally destroyed, and covering at least a portion of said semiconductor chip, said insulating resin layer and said base surface.

* * * * *